(12) United States Patent
Schmidt et al.

(10) Patent No.: US 10,349,510 B2
(45) Date of Patent: Jul. 9, 2019

(54) METHOD FOR ADDITIVELY MANUFACTURING COMPONENTS

(71) Applicant: UNITED TECHNOLOGIES CORPORATION, Farmington, CT (US)

(72) Inventors: Wayde R. Schmidt, Pomfret Center, CT (US); Paul Sheedy, Bolton, CT (US)

(73) Assignee: UNITED TECHNOLOGIES CORPORATION, Farmington, CT (US)

( * ) Notice: Subject to any disclaimer, the term of this patent is extended or adjusted under 35 U.S.C. 154(b) by 30 days.

(21) Appl. No.: 15/662,792

(22) Filed: Jul. 28, 2017

(65) Prior Publication Data

US 2019/0037678 A1    Jan. 31, 2019

(51) Int. Cl.
*H05H 1/26* (2006.01)
*H05H 1/24* (2006.01)
*H01J 37/32* (2006.01)
*B29C 64/209* (2017.01)
*B33Y 30/00* (2015.01)

(52) U.S. Cl.
CPC ............ *H05H 1/24* (2013.01); *B29C 64/209* (2017.08); *B33Y 30/00* (2014.12); *H01J 37/32* (2013.01)

(58) Field of Classification Search
CPC .......... H01L 23/49822; H01L 23/5389; H01L 23/13; H01L 24/27; H01L 2224/76184; H01L 2224/76155; H05K 1/0284; H05H 1/30; H05H 1/46; H05H 1/42; H05H 1/26; H05H 1/341; H05H 1/3405; H05H 2001/3457; B82Y 30/00; B23K 10/00; B23K 10/02; B23K 9/291
See application file for complete search history.

(56) References Cited

U.S. PATENT DOCUMENTS

| | | | | |
|---|---|---|---|---|
| 3,122,321 | A * | 2/1964 | Wilson | B05B 7/203 239/84 |
| 3,648,015 | A * | 3/1972 | Fairbairn | H05H 1/30 219/121.24 |
| 3,975,615 | A * | 8/1976 | Konishi | B23K 10/02 219/126 |
| 7,641,461 | B2 * | 1/2010 | Khoshnevis | B29C 64/106 249/20 |
| 8,066,932 | B2 * | 11/2011 | Xu | C04B 35/62236 264/444 |
| 9,076,626 | B2 | 7/2015 | Ribton et al. | |
| 2009/0065485 | A1 * | 3/2009 | O'Neill | H05H 1/46 219/121.52 |
| 2011/0318503 | A1 * | 12/2011 | Adams | C23C 4/02 427/535 |

(Continued)

FOREIGN PATENT DOCUMENTS

WO    2016060703    4/2016

*Primary Examiner* — Haissa Philogene
(74) *Attorney, Agent, or Firm* — Carlson, Gaskey & Olds, P.C.

(57) ABSTRACT

A nozzle for additive manufacturing includes a plasma gas tube operable to provide plasma gas to a plasma flame, and a source material tube arranged concentrically inside the plasma gas tube such that the source material passes through the plasma flame. An apparatus and method for additive manufacturing are also disclosed.

17 Claims, 1 Drawing Sheet

(56) References Cited

U.S. PATENT DOCUMENTS

2012/0128898 A1\* 5/2012 Inoue .................... B82Y 30/00
                                                    428/1.1
2016/0198576 A1\* 7/2016 Lewis ............... H01L 23/49822
                                                    361/761
2018/0200954 A1    7/2018 Mukhopadhyay \* cited by examiner

US 10,349,510 B2

METHOD FOR ADDITIVELY MANUFACTURING COMPONENTS

BACKGROUND

This disclosure relates to a method of additive manufacturing components, and in particular, components for gas turbine engines such as printed electronics, magnetic systems, and optical devices.

Additive manufacturing techniques typically include delivering material in multiple layers onto flat and conformal surfaces. The material can be used to create surface features on components. Various materials can be used to create these surface features, depending on the desired properties of the surface features. Some additive manufacturing methods require complex material "ink" formulations and multi-step post processing to obtain the desired properties of the surface features, especially where the desired final material composition is difficult to deposit directly. Furthermore, many additive manufacturing techniques are difficult to perform on a small scale.

SUMMARY

A nozzle for additive manufacturing according to an example of the present disclosure includes a plasma gas tube operable to provide plasma gas to a plasma flame, and a source material tube arranged concentrically inside the plasma gas tube. The source material passes through the plasma flame.

In a further embodiment of any foregoing embodiments, the nozzle comprises an induction coil around an exterior of the plasma gas tube for heating the plasma gas, thereby generating the plasma flame.

In a further embodiment of any foregoing embodiments, the nozzle comprises a sheath gas tube arranged concentrically between the plasma gas tube and the source material tube. The sheath gas tube is operable to carry a sheath gas.

In a further embodiment of any foregoing embodiments, the sheath gas directs the source material through the plasma flame.

In a further embodiment of any foregoing embodiments, the sheath gas is operable to shape the plasma flame.

In a further embodiment of any foregoing embodiments, the source material is a precursor material, and the source material is changed into a final material as it passes through the nozzle.

In a further embodiment of any foregoing embodiments, the nozzle wherein the change includes at least one of chemically modifying, functionalizing, reacting, or inducing a partial or full change in state or phase.

In a further embodiment of any foregoing embodiments, wherein the change includes reacting, and the reacting is between the plasma flame and the precursor material.

In a further embodiment of any foregoing embodiments, the nozzle wherein the change includes reacting, and the reacting is between the sheath gas and the precursor material.

An apparatus for additive manufacturing according to an example of the present disclosure includes a component arranged on a platform, and a nozzle including a plasma gas tube to provide plasma gas to a plasma flame and a source material tube arranged inside the plasma gas tube such that the source material passes through the plasma flame. The nozzle is operable to deposit a printed feature onto the component.

In a further embodiment of any foregoing embodiments, the apparatus where the nozzle is mounted on a robotic arm, the robotic arm operable to move the nozzle with respect to the platform to deposit the printed feature.

In a further embodiment of any foregoing embodiments, the platform is operable to move with respect to the nozzle as the nozzle deposits the printed feature.

In a further embodiment of any foregoing embodiments, the plasma flame does not contact the component.

In a further embodiment of any foregoing embodiments, further comprising an induction coil around an exterior of the plasma gas tube for heating the plasma gas thereby generating the plasma flame.

In a further embodiment of any foregoing embodiments, a sheath gas tube is arranged concentrically between the plasma gas tube and the source material tube, the sheath gas tube operable to carry a sheath gas.

A method for additive manufacturing according to an example of the present disclosure includes providing a plasma gas to a plasma flame via a plasma gas tube, depositing a source material onto a component by providing the source material to the plasma flame via a source material tube. The source material tube is arranged concentrically within the plasma gas tube.

In a further embodiment of any foregoing methods, the method further includes providing a sheath gas to a sheath gas tube, the sheath gas tube is arranged concentrically between the source material tube and the plasma gas tube.

In a further embodiment of any foregoing methods, the method further includes heating the plasma gas to produce the plasma flame by an induction coil, the induction coil arranged around and exterior of the plasma gas tube.

In a further embodiment of any foregoing methods, the source material is a precursor material, and the method further includes changing the source material prior to the depositing step.

In a further embodiment of any foregoing methods, the changing includes at least one of chemically modifying, functionalizing, reacting, or inducing a partial or full change in state or phase.

DETAILED DESCRIPTION

Figure 1:
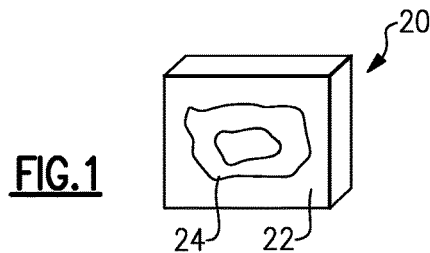
FIG. 1 schematically shows an additively manufactured component.

FIG. 1 schematically shows an example component 20. In the example of FIG. 1, the component 20 includes a substrate 22 and a printed feature 24. The illustrated component 20 is an electronic component with printed features for a gas turbine engine. However, in other examples, the component 20 is another type of component with printed features. For instance, the component 20 can be a blade outer air seal with printed friction characteristics that optimize rubbing of components, a component with a printed coating having a desired surface roughness, a component with surface features that enhance control of fluid flow past the component, a component for a magnetic system, or a component for an optical device.

Figure 2:
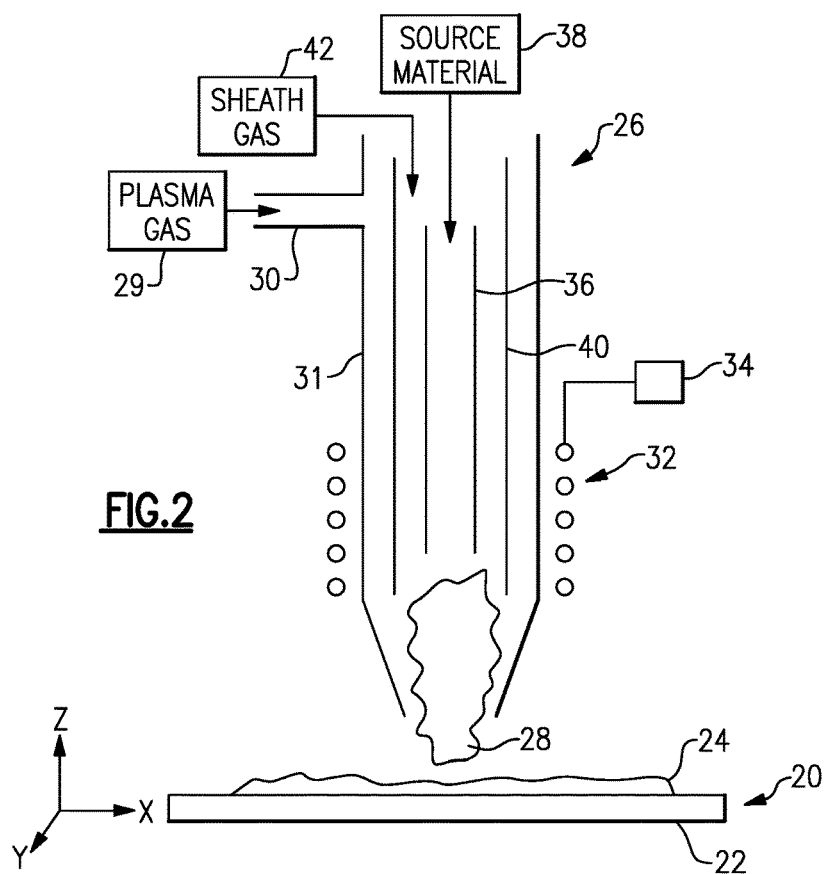
FIG. 2 schematically shows a nozzle for additively manufacturing a component.

FIG. 2 schematically shows a nozzle 26 for additively manufacturing the component 20. The nozzle 26 generally includes a plasma flame 28. A plasma gas 29 flows from a plasma gas inlet 30 through a plasma gas tube 31. An induction coil 32 is arranged around the exterior of the plasma gas tube 31 and heats the plasma gas 29 to form the plasma flame 28. The induction coil 32 is powered by a power source 34. In one example, the induction coil 32 is a radio frequency induction coil. In one example, the plasma flame 28 is between about 1 and 100 microns (0.0394 and 3.937 mils) in diameter. The plasma flame 28 can be argon-, helium-, nitrogen-, oxygen- or hydrogen-based, in some examples or combinations thereof.

The nozzle 26 also includes a source material tube 36 concentrically within the plasma gas tube 31. The source material tube 36 feeds source material 38 through the plasma flame 28. The source material 38 (or "ink") is deposited (or "printed") onto the component 20 as a printed feature 24. Because the source material 38 is fed directly into the plasma flame 28 axially, the source material 38 is subjected to more uniform heating in contrast to other systems which utilize radial material injection.

The induction coil 32 allows for precise control over the plasma flame 28 on the small (micron-sized) scale, which in turn allows for precise control over the deposition of the printed feature 24. Furthermore, because the induction coil 32 is on the exterior of the plasma gas tube 31, it produces a clean plasma flame 28 and reduces the risk of contaminating the source material 38.

In some examples, the source material 38 contains at least one of metals, ceramics, carbon, alloys, polymers, or combinations thereof. For instance, the source material 38 may contain metals, intermetallics, ceramics, carbon, alloys, polymers, or combinations thereof in a liquid carrier, such as an aqueous or organic carrier. In another example, the source material 38 may contain solid or powdered metals, ceramics, carbon, alloys, polymers, or combinations thereof in a carrier gas. The liquid carrier or carrier gas carries the source material 38 through the plasma flame 28. In further examples, the source material 38 is a flowable melt or liquid precursor or a solution of soluble salts, organometallic compounds or oligomeric or polymeric precursors.

In a further example, the source material 38 may contain a refractory ceramic such as silicon carbide, silicon nitride, silicon oxycarbide, silicon oxynitride, hafnium carbide, aluminum oxide, or another oxide. Additional examples of ceramics of interest include non-oxides such as nitrides, carbides, phosphides, borides and carbonitrides. In another example, the source material 38 may contain a conductive metal such as copper, silver, platinum, palladium, or gold. In other examples, the source material 38 may contain a dielectric, a metal superalloy, a metallic silicide, a refractory metal, a shape memory alloy, a heating element composition such as iron-chromium-aluminum alloy or nichrome, and a bulk metallic glass. The source material 38 "ink" can include at least one of a powder, a liquid, a solution, a gas, a slurry, or mixtures thereof.

In one example, the nozzle 26 also includes one or more sheath gas tubes 40 arranged concentrically between the plasma gas tube 31 and the source material tube 36. In the example of FIG. 2, the nozzle 26 includes one sheath gas tube 40. However, in other examples, the nozzle 26 includes more sheath gas tubes 40. Sheath gas 42 flows through the sheath gas tube 40 and can be used to direct the source material 38 through the plasma flame 28 to the substrate 20. In another example, the sheath gas 42 shapes the plasma flame 28 and/or directs it towards the component 20.

In some examples, the sheath gas 42 is inert with respect to the source material 38 and limits reactivity of the source material 38 during the deposition process. However, in other examples, when the source material 38 is a precursor as discussed above, the sheath gas 42 can react with the source material 38 as it passes through the plasma flame 28 and the product of the reaction is the material of the printed feature 24.

In one example, the source material 38 is a precursor material to the material of the printed feature 24. In this example, a change is induced in the precursor material which transfers the precursor material into the material of the printed feature 24. The change can be induced by simply passing the source material 38 through the plasma flame 28. In other examples, the change is induced by reaction with either the plasma flame 28 itself (i.e., based on selection of the plasma gas 29) and/or by reaction with the sheath gas 42. For instance, the change includes at least one of chemically modifying, functionalizing, reacting, or inducing a partial or full change in state or phase. Using a precursor material allows for increased flexibility in selecting the properties of the material to be deposited as the printed feature. Additionally, using a precursor material allows for one-step deposition of the desired printed feature 24, without the need for post-processing. For instance, using a preceramic polymer-based precursor material or soluble organometallic compound to deposit the desired ceramic printed feature 24 eliminates the need for removing non-beneficial organic matter that could diminish the ceramic printed feature's 24 function. It also allows for the deposition of material that can be difficult to deposit, such as dense or highly refractory ceramic or metal structures, while fully realizing the beneficial bulk properties of such materials. Finally, because the change from precursor material to final printed feature 24 material occurs as the precursor material passes through the plasma flame 28 local to the surface of the substrate 22 of component 20, the material of the printed feature 24 can form a chemical bond with the component 20, as opposed to merely a mechanical bond which may form when a source material 38 is directly deposited onto a component 20. Furthermore, for the deposition of metals in particular, using a precursor material may at least partially avoid undesirable features of depositing particulate metals in additive manufacturing procedures, such as cracking, defects or porosity.

As described above, the source material 38 passes through the plasma flame 28 and is deposited onto the component 20 as the printed feature 24. In operation, the nozzle 26 "prints" the printed feature 24 in successive layers, with each layer building on top of the previous layer in the z-direction. In one example, each pass of the nozzle 26 prints material onto the component 20 with a width of between about 0.7 and 500 microns (0.0276 to 19.685 mils) and a thickness between about 0.15 and 125 microns (0.0059 and 4.9212 mils). In some instances, multiple passes in the x-y plane may be used to deposit the desired width of printed feature 24.

In one example, the plasma flame 28 does not contact the component 20 during deposition of the printed feature 24, and the component 20 is electrically neutral with respect to the deposition process, i.e., the component 20 does not act as an electrode. In another example, however, the plasma flame 28 does contact the component 20. In this example, the component 20 substrate 22 may be precoated with a material, and the plasma flame 28 completes a reaction that transforms the precoated material into the printed feature 24.

Figure 3:
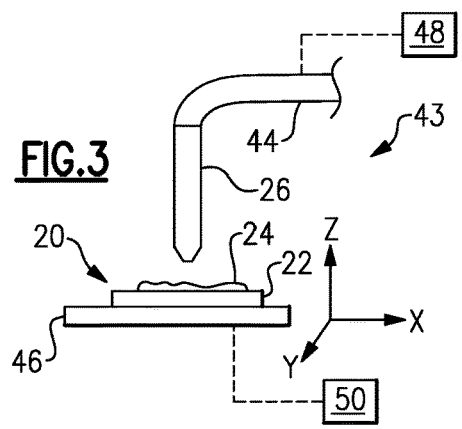
FIG. 3 schematically shows an apparatus for additively manufacturing a component.

An apparatus 43 for additive manufacturing is shown in FIG. 3. The apparatus 43 includes the nozzle 26 and a platform 46 on which the component 20 sits. In one example, shown in FIG. 3, the nozzle 26 is mounted on a robotic arm 44. The robotic arm 44 is operable to move the nozzle 26 with respect to the component 20 based on information from a controller 48. In one example, the robotic arm 44 moves the nozzle 26 in the x-y plane with respect to the component 20 to deposit the printed feature 24 in a desired shape, while the component 20 and platform 46 remain stationary. However, in other examples, the robotic arm 44 is operable to provide multi-axial movement of the nozzle 26 with respect to the component 20 and platform 46 in any of the x, y, and z directions along with rotations about the x, y, and z directions. In another example, the component 20 is arranged on a platform 46 operable to move based on information from a controller 50. In one example, the platform 46 and component 20 are operable to move in an x-y plane relative to the nozzle 26 as the nozzle 26 deposits the printed feature 24 in a desired shape, while the nozzle 26 is stationary. In other examples, the platform 46 is operable to move in any of the x, y, and z directions as well as provide rotations about the x, y, and z directions.

Furthermore, the foregoing description shall be interpreted as illustrative and not in any limiting sense. A worker of ordinary skill in the art would understand that certain modifications could come within the scope of this disclosure. For these reasons, the following claims should be studied to determine the true scope and content of this disclosure.

What is claimed is:

1. A nozzle for additive manufacturing, comprising:
   a plasma gas tube operable to provide plasma gas to a plasma flame;
   a source material tube arranged concentrically inside the plasma gas tube such that source material passes through the plasma flame; and
   a sheath gas tube arranged concentrically between the plasma gas tube and the source material tube, the sheath gas tube operable to carry a sheath gas.

2. The nozzle of claim 1, further comprising an induction coil around an exterior of the plasma gas tube for heating the plasma gas, thereby generating the plasma flame.

3. The nozzle of claim 1, wherein the source material is a precursor material, and the source material is changed into a final material as it passes through the nozzle.

4. The nozzle of claim 1, wherein the sheath gas directs the source material through the plasma flame.

5. The nozzle of claim 1, wherein the sheath gas is operable to shape the plasma flame.

6. The nozzle of claim 3, wherein the change includes at least one of chemically modifying, functionalizing, reacting, or inducing a partial or full change in state or phase.

7. The nozzle of claim 6, wherein the change includes reacting, and the reacting is between the sheath gas and the precursor material.

8. The nozzle of claim 6, wherein the change includes reacting, and the reacting is between the plasma flame and the precursor material.

9. An apparatus for additive manufacturing, comprising:
   a component arranged on a platform;
   a nozzle, the nozzle including a plasma gas tube operable to provide plasma gas to a plasma flame, and a source material tube arranged concentrically inside the plasma gas tube such that source material passes through the plasma flame, the nozzle operable to deposit a printed feature onto the component; and
   a sheath gas tube arranged concentrically between the plasma gas tube and the source material tube, the sheath gas tube operable to carry a sheath gas.

10. The apparatus of claim 9, further comprising an induction coil around an exterior of the plasma gas tube for heating the plasma gas, thereby generating the plasma flame.

11. The apparatus of claim 9, wherein the nozzle is mounted on a robotic arm, the robotic arm operable to move the nozzle with respect to the platform to deposit the printed feature.

12. The apparatus of claim 9, wherein the platform is operable to move with respect to the nozzle as the nozzle deposits the printed feature.

13. The apparatus of claim 9, wherein the plasma flame does not contact the component.

14. A method for additive manufacturing, comprising:
    providing a plasma gas to a plasma flame via a plasma gas tube;
    depositing a source material onto a component by providing the source material to the plasma flame via a source material tube, the source material tube arranged concentrically within the plasma gas tube; and
    providing a sheath to a sheath gas tube, the sheath gas tube arranged concentrically between the source material tube and the plasma gas tube.

15. The method of claim 14, further comprising heating the plasma gas to produce the plasma flame by an induction coil, the induction coil arranged around and exterior of the plasma gas tube.

16. The method of claim 14, wherein the source material is a precursor material, and further comprising changing the source material prior to the depositing step.

17. The method of claim 16, wherein the changing includes at least one of chemically modifying, functionalizing, reacting, or inducing a partial or full change in state or phase.

* * * * *